United States Patent
Brunet et al.

(10) Patent No.: US 8,813,017 B2
(45) Date of Patent: Aug. 19, 2014

(54) GATE MODELING FOR SEMICONDUCTOR FABRICATION PROCESS EFFECTS

(75) Inventors: Jean-Marie Brunet, San Jose, CA (US); William S. Graupp, Aurora, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 13/286,004

(22) Filed: Oct. 31, 2011

(65) Prior Publication Data
US 2012/0144350 A1    Jun. 7, 2012

Related U.S. Application Data

(63) Continuation of application No. 12/502,922, filed on Jul. 14, 2009, now Pat. No. 8,051,393, which is a continuation of application No. 11/707,661, filed on Feb. 16, 2007, now Pat. No. 7,577,932.

(60) Provisional application No. 60/774,511, filed on Feb. 17, 2006.

(51) Int. Cl.
*G06F 17/50*    (2006.01)

(52) U.S. Cl.
USPC ............... 716/132; 716/101; 716/139

(58) Field of Classification Search
CPC .......... G06F 17/50; G06F 15/04; G06F 9/455
USPC .......................... 716/101, 132, 139
See application file for complete search history.

(56) References Cited

U.S. PATENT DOCUMENTS

| | | | |
|---|---|---|---|
| 5,610,833 A | 3/1997 | Chang et al. | |
| 6,219,630 B1 | 4/2001 | Yonezawa et al. | |
| 6,562,638 B1 | 5/2003 | Balasinski et al. | |
| 6,578,190 B2 | 6/2003 | Ferguson et al. | |
| 6,668,366 B2 * | 12/2003 | Liao et al. | ........................ 716/54 |
| 6,841,404 B2 | 1/2005 | Kawamura et al. | |
| 6,954,911 B2 | 10/2005 | Pierrat | |

(Continued)

FOREIGN PATENT DOCUMENTS

WO    WO 2007/100558 A2    9/2007

OTHER PUBLICATIONS

International Preliminary Report on Patentability for PCT/US2007/004414 (published as WO 2007/100558 A2), Aug. 19, 2008, 6 pages.

(Continued)

*Primary Examiner* — Thuan Do
(74) *Attorney, Agent, or Firm* — Klarquist Sparkman, LLP

(57) ABSTRACT

In one embodiment, a method for determining a contour simplification of an object for a simulation is provided. An object in a layout of a transistor design to be created with the photolithographic process is determined. The object includes a width and a length in the layout. A contour simulation is performed to determine a generated contour object. The contour simulation simulates parametric variation factors that may occur in the photolithographic process. An adjusted width and adjusted length of the object is then determined based on the generated contour object. The adjusted width and the adjusted length are usable to determine a parametric model for simulation of the object. For example, a layout versus schematic (LVS) tool may back-annotate the layout. Then, a SPICE simulation may use the output of the LVS tool to verify the electrical behavior of the transistor using the adjusted width and adjusted length.

31 Claims, 6 Drawing Sheets

(56) References Cited

U.S. PATENT DOCUMENTS

| | | |
|---|---|---|
| 7,098,572 B2 | 8/2006 | Choi et al. |
| 7,360,191 B2 | 4/2008 | Chang et al. |
| 7,383,521 B2 * | 6/2008 | Smith et al. .................. 716/114 |
| 7,451,429 B2 | 11/2008 | Ikeuchi |
| 7,577,932 B2 | 8/2009 | Brunet et al. |
| 8,015,510 B2 | 9/2011 | Brunet et al. |
| 8,051,393 B2 | 11/2011 | Brunet et al. |
| 2005/0132306 A1 | 6/2005 | Smith et al. |
| 2005/0251771 A1 | 11/2005 | Robles |
| 2005/0268256 A1 | 12/2005 | Tsai et al. |
| 2006/0150132 A1 | 7/2006 | Gupta |
| 2006/0236271 A1 | 10/2006 | Zach |
| 2006/0265679 A1 | 11/2006 | Scheffer et al. |
| 2007/0204242 A1 | 8/2007 | Brunet et al. |
| 2007/0204256 A1 | 8/2007 | Brunet et al. |
| 2008/0115096 A1 | 5/2008 | Pikus |
| 2008/0115097 A1 | 5/2008 | Pikus et al. |
| 2009/0276749 A1 | 11/2009 | Brunet et al. |

OTHER PUBLICATIONS

International Search Report for PCT/US2007/004414 (published as WO 2007/100558 A2), Sep. 7, 2008, 3 pages.

* cited by examiner

US 8,813,017 B2

GATE MODELING FOR SEMICONDUCTOR FABRICATION PROCESS EFFECTS

CROSS REFERENCE TO RELATED APPLICATIONS

This is a continuation of U.S. patent application Ser. No. 12/502,922, entitled "GATE MODELING FOR SEMICONDUCTOR FABRICATION PROCESS EFFECTS," filed Jul. 14, 2009 (now U.S. Pat. No. 8,051,393), which is a continuation of U.S. patent application Ser. No. 11/707,661, entitled "GATE MODELING FOR SEMICONDUCTOR FABRICATION PROCESS EFFECTS," filed Feb. 16, 2007 (now U.S. Pat. No. 7,577,932), which claims the benefit of U.S. Provisional Patent Application Ser. No. 60/774,511, entitled "CONTOUR DERIVATION FOR LFD AND EXTRACTION," filed on Feb. 17, 2006, all of which are hereby incorporated by reference as if set forth in full in this application for all purposes.

BACKGROUND

Particular embodiments generally relate to modeling for photolithographic processing and more particularly to contour generation for integrated circuit designs due to process variations.

In a conventional integrated circuit design process, a circuit designer begins with a conceptual idea of what functions an integrated circuit is to perform. The circuit designer then creates a circuit design on a computer and verifies it using one or more simulation tools to ensure that the circuit will operate as desired. The design at this stage may be represented by what is commonly viewed as a circuit schematic, but may also be represented by higher level abstractions within the computer.

These abstract designs are then converted to physical definitions of the circuit elements to be fabricated. These definitions, often called the drawn design of the circuit layout, represent the geometric boundaries for the physical devices to be fabricated—transistor gates, capacitors, resistive interconnecting wires, etc. A number of data formats have been created to represent these physical layouts, including Graphic Data System (GDS) II and OASIS™. Often, each physical layer of the circuit has a corresponding data layer to represent the polygonal boundaries of the elements in that layer.

Once the circuit layout has been defined, additional verification checks are performed. Some of these verification checks are to insure that the physical structures will correctly represent the desired electrical behavior. The devices in the layout may be extracted by a tool, such as an LVS, for Layout vs. Schematic or Layout vs. Source tool. Additional extraction of parasitic resistances and capacitances can be done, and the dynamic behavior of the circuit can be estimated for the layout as well. This step is traditionally called parasitic extraction. Then, the electrical behavior of the extracted device may be tested using a simulation tool, such as a Simulation Program with Integrated Circuit Emphasis (SPICE) tool. This is typically referred to as a parametric simulation.

In a parametric simulation, the width and length of a gate in a circuit layout may be used in a model to simulate the electrical behavior of the transistor. For example, the layout of a transistor may be back-annotated using the LVS. The SPICE simulator uses the width and length to simulate the electrical behavior of the transistor to verify its electrical behavior in silicon.

Due to process variations, the geometric shapes that are actually manufactured using a photolithographic process may vary from the circuit layout in the drawn design. Because of the process variations, the width and length from the drawn design may not provide an accurate simulation of the transistor. One solution for taking into account the process variations includes breaking up the area of the gate into an N number of segments. The width and length for each of these segments is then used in verifying the electrical behavior. This process, however, feeds N number of segments into the simulation. This is a computationally expensive and thus is undesirable.

SUMMARY

In one embodiment, a method for determining a contour for an object is provided. An object in a layout of a transistor design to be created with the photolithographic process is determined. The object includes a width and a length in the layout. A contour generation is performed to estimate the dimensions of the object after processing. The contour generation includes parametric variations that may occur in the photolithographic process. An adjusted width and adjusted length of the object is then determined based on the contour. The adjusted width and the adjusted length are usable to determine a parametric model for simulation of the electrical behavior of the object. For example, a layout versus schematic (LVS) tool may back-annotate the layout. Then, a SPICE simulation may use the output of the LVS tool to verify the electrical behavior of the transistor using the adjusted width and adjusted length.

The adjusted length and adjusted width represent the contoured edges that may result due to processing variations. This may result in a more accurate simulation of what actually is manufactured using a photolithographic process. Also, a SPICE simulation may expect to receive width and length values for an object, such as a gate area. Thus, by providing an adjusted width and adjusted length, the simulation methodology does not have to be significantly changed.

A further understanding of the nature and the advantages of particular embodiments disclosed herein may be realized by reference of the remaining portions of the specification and the attached drawings.

DETAILED DESCRIPTION OF EMBODIMENTS

Figure 1A:
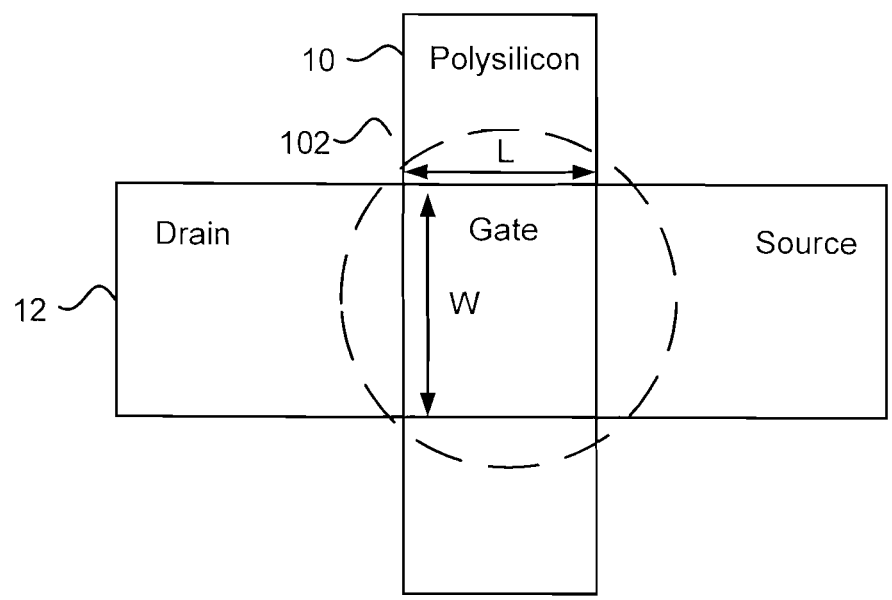
FIG. 1A illustrates a simplified integrated circuit layout of a transistor including a pair of objects or features to be created on a semiconductor wafer.

FIG. 1A illustrates a simplified integrated circuit layout of a transistor including a pair of objects or features 10, 12 to be created on a semiconductor wafer. In conventional lithographic processing, a layout for an Integrated Circuit (IC) design is stored in a layout format, such as GDS-II or OASIS™, that defines the objects as a number of vertices that in turn define corresponding polygons. The edges of the polygons defined between the vertices can then be further fragmented into additional, smaller edge segments and adapted to ensure the manufacturability of the polygons on a wafer.

FIG. 1A shows a transistor layout that models a drain, polysilicon line, and source. The region where the polysilicon line is between the source and drain is the transistor gate. Although this layout is described, it will be understood that other objects in integrated circuit designs may be used. Layouts may also be simulated using particular embodiments described in U.S. patent application Ser. No. 11/707,635, filed Feb. 16, 2007 (now U.S. Pat. No. 8,015,510), entitled "INTERCONNECTION MODELING FOR SEMICONDUCTOR FABRICATION PROCESS EFFECTS," which is incorporated by reference in its entirety for all purposes.

As shown in FIG. 1A, a width, W, and length, L, of gate object 102 in the layout can be determined. This may be considered the drawn design, or ideal design, of the width and length as it does not take into account any process variations that may occur in a photolithography process. In one example, the width and length is for a critical dimension (CD) of the gate of a transistor; however, it will be understood that other width and length measurements may be used. The critical dimension may be a portion of the gate that is electrically sensitive to process variations. Although a gate is described, it will be understood that other objects of an integrated circuit design may be used. For example, the object may be any element that captures a design-intent and process condition. Due to process variations, the electrical behavior can be affected if variations occur in electrically sensitive areas of the design (e.g., polysilicon gate width differences between a pair of matched transistors). Accordingly, these areas may be simulated to determine if the process variations will affect the electrical behavior.

Figure 1B:
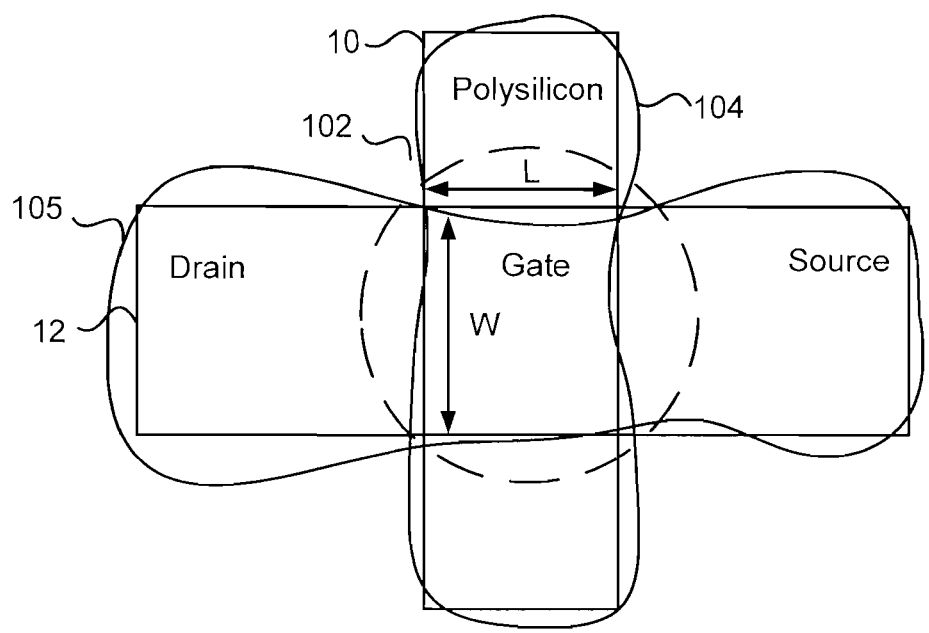
FIG. 1B illustrates the objects of FIG. 1A after modeling for process variations to more accurately predict the shape the transistor will have after undergoing a photolithographic process according to one embodiment.

FIG. 1B illustrates the objects of FIG. 1A after modeling for process variations to more accurately predict the shape the transistor will have after undergoing a photolithographic process according to one embodiment. As shown in FIG. 1B, contoured edges 104 of object 10 and contoured edges 105 of object 12 are modeled as deviating from the drawn design due to process variations. As discussed above, process conditions can vary from wafer to wafer or from chip to chip within a wafer. Examples of process conditions that may vary include, but are not limited to, focus, dose, etch processing, polishing variations, etc. Variations can occur in the focus of the image on the wafer, the dose of illumination light through the mask or reticle, the overlay of the stepper or scanner, the thickness of materials on the wafer, the resist development and processing conditions, as well as other process conditions that affect how the circuit will be created on the wafer.

In a parametric simulation, the width and length of object 102 in a circuit layout may be used in a model to simulate the electrical behavior of the transistor. Devices in the layout may be extracted from a layout using the LVS. For example, the width and length of a gate is used to back-annotate the gate in the layout. The SPICE simulator uses the width and length to simulate the electrical behavior of the transistor to verify its electrical behavior in silicon.

Accordingly, if the width and length of object 102 shown in FIG. 1A is used in a model of a simulation to verify the electrical behavior of the transistor, then the simulation may not accurately simulate how the transistor will electrically behave after undergoing photolithography processing. This is because the width and length of object 102 in FIG. 1A may not accurately represent the contouring of edges 104 that may occur due to processing variations. Thus, the parametric simulation using the width and length of object 102 in FIG. 1A may not be useful.

To take into consideration how process variations may affect the objects created on a wafer, particular embodiments determine an adjusted width $W_{adj}$ and adjusted length $L_{adj}$ that represent the processing variations that may occur during a photolithographic process. The adjusted width and adjusted length represent an object 102 shown in FIG. 1B. The width and length in FIG. 1B vary from the uneven contouring that may result. As will be described in more detail below, the length and width may vary depending upon where it is measured due to the uneven contouring. Thus, particular embodiments determine an adjusted width and adjusted length that represent the feature with contouring.

In one embodiment, a single value for an adjusted width and a single value for an adjusted length are determined for an object. Thus, segmenting the object into N segments and using the width and length values for each the N segments in a parametric simulation is not necessary. Rather, only the adjusted width and adjusted length is needed to perform the parametric simulation. Because the parametric simulation tools are typically configured to receive one width and length for the object, changes to the methodology for performing the parametric simulation are not needed. However, if the object is segmented into N segments and a series of widths and lengths for each segment is needed for the parametric simulation, then resources use is expensive in addition to having to change the parametric simulation methodology.

Figure 2:
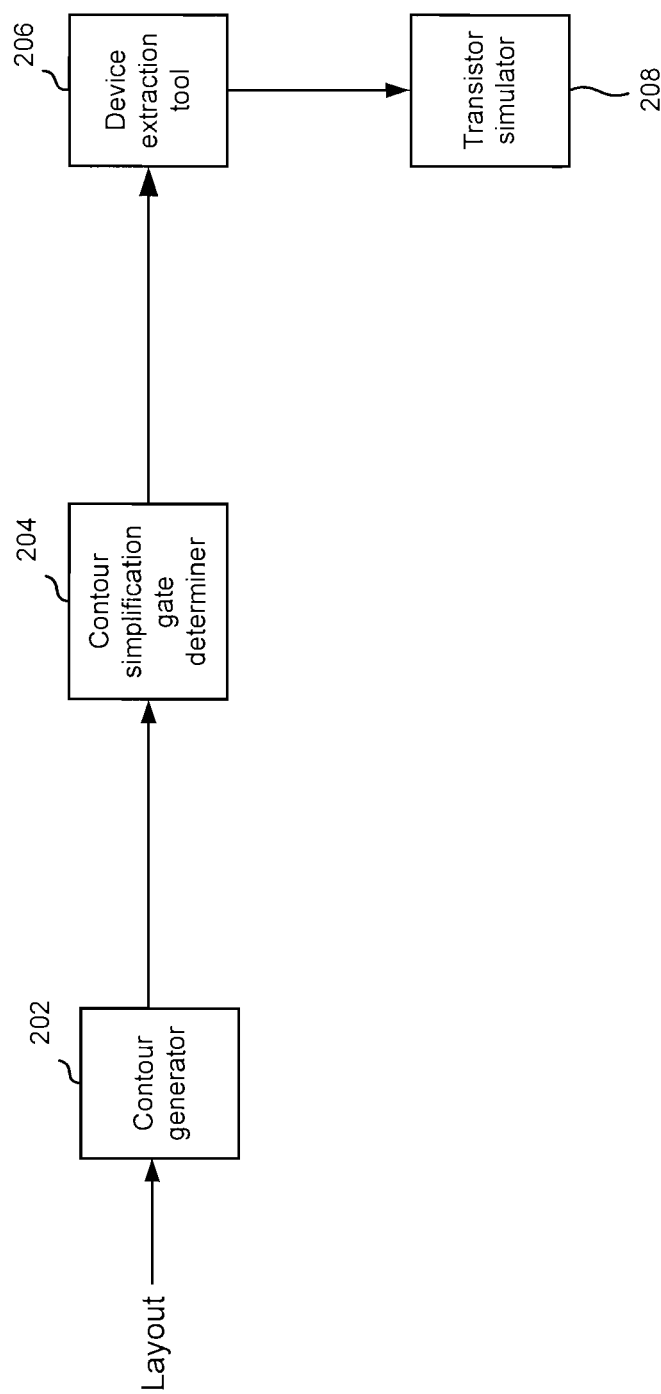
FIG. 2 depicts an example of a system for providing contour-based simulation according to a particular embodiment.

FIG. 2 depicts an example of a system 200 for providing contour-based simulation according to a particular embodiment. As shown, a contour generator 202, a contour simplification gate determiner 204, a device extraction tool 206, and a transistor simulator 208 are provided.

Contour generator 202 is configured to perform a contour generation by simulating process variations that may occur in a lithographic process. Contour generator 202 receives a layout of a transistor. For example, the layout may represent geometric boundaries for physical devices to be fabricated, such as transistor gates, capacitors, resistive-interconnecting wires, etc. Any data format may be used to represent the physical layout, such as GDS-II, OASIS™, etc.

Contour generator 202 uses process variation factors to generate a contour representation of the layout. The process variation factors may be any information that models process variations that may occur in the photolithographic process. As shown in FIG. 1B, a possible contour simulation shows contours in the geometric shapes of a transistor layout that may occur.

The electrical behavior of a portion of the contour representation of the layout may be tested. The portion may be referred to as a generated contour object. The simulation using generated contours may be an expensive computation. Thus, if it is done full chip, then the cost in time may be exorbitant. Accordingly, in some embodiments, a selective simulation may be determined. For example, a method for determining which areas of an integrated circuit may be tested is provided. These areas of interest may be where variation between the contour and drawn edges may have a good chance to be significantly different due to process variations.

Figure 3A:
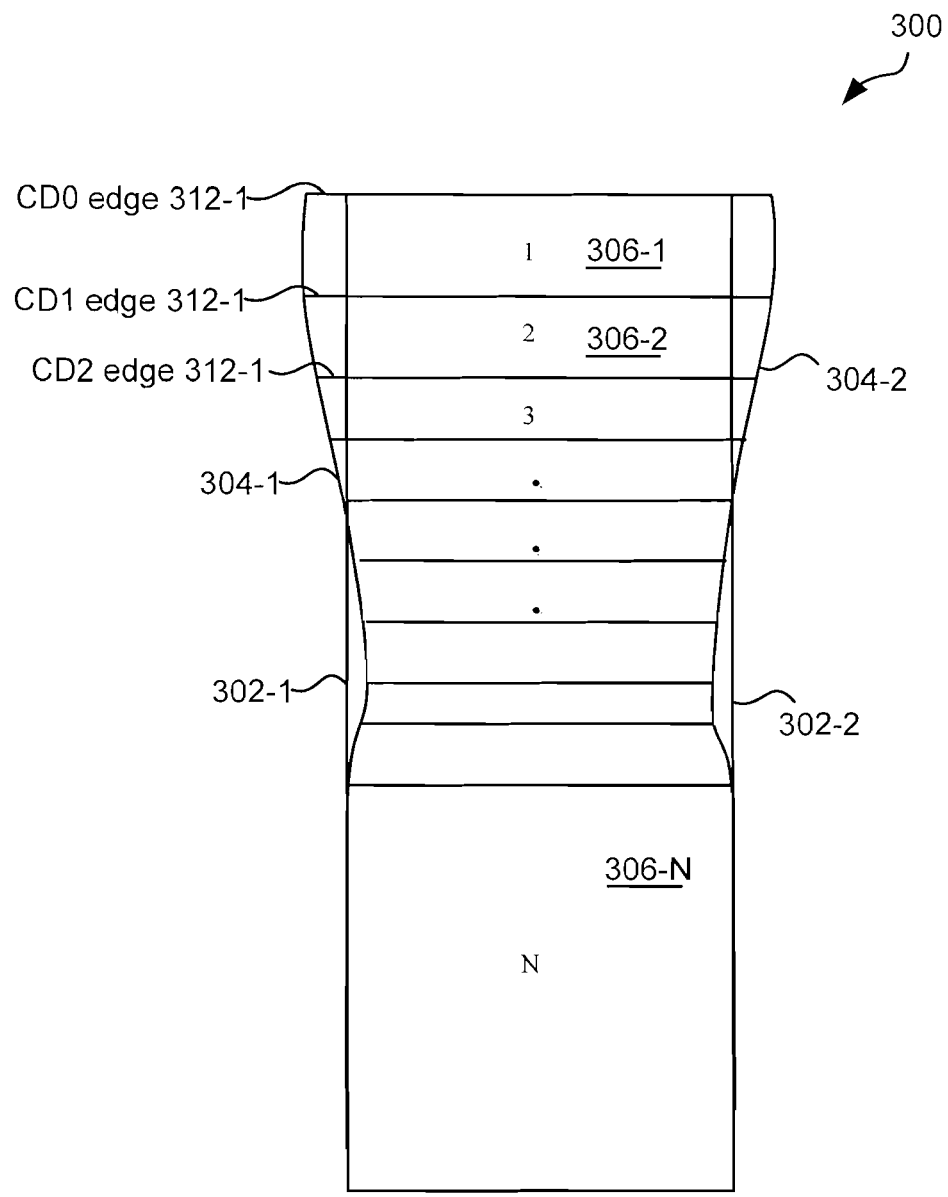
FIG. 3A shows an example of a contour simulated object used for determining an adjusted length according to one embodiment.

FIG. 3A shows an example of a generated contour object 300 used for determining an adjusted length according to one embodiment. As shown, drawn edges 302-1 and 302-2 represent edges in the drawn design of the transistor layout. That is, these edges 302-1 and 302-2 are the edges in the layout without taking into account any processing variations. Contoured edges 304-1 and 304-2, however, show the contoured edges that may result after processing variations factors are modeled in a photolithographic process.

As shown in FIG. 3A, contoured edges 304 differ from drawn edges 302. Thus, using a length from drawn edges 302 may not yield an accurate parametric simulation of the object. Accordingly, contour simplification gate module 204 is configured determine an adjusted length for generated contour object 300. The adjusted length may be used to represent the generated contour object 300 based on processing variation factors for the photolithographic process.

As shown in FIG. 3A, a drawn length would be the length of an edge from drawn edge 302-1 to drawn edge 302-2. However, due to process variations, contoured edges 304-1 and 304-2 vary from drawn edges 302-1 and 302-2. Thus, using the drawn length does not accurately represent the length in generated contour object 300. Contoured edges 304 may deviate from drawn edges 302 differently at various points along contour simulated object 300. For example, a segment 312-1 is a different length from a segment 312-3. Thus, a determination of the adjusted length takes into account the variations in contoured edges 304. Different ways of calculating the adjusted length may be appreciated. In one embodiment, the object 300 may be broken up into segments 306 as shown in FIG. 3A. In one embodiment, the adjusted length of generated contour object 300 is determined based on the measured length of CD edges 312 and the area of the segments. For example, the following equation 1.1 may be used:

$$L_{adj} = \sum_{1}^{N} \left[ \frac{AREA_N \cdot \left( \frac{CD_{N-1} + CD_N}{2} \right)}{\sum_{1}^{N} AREA_N} \right] \quad (1.1)$$

In equation 1.1, the area of a segment 306 is determined, such as the area of segment 306-1. The area of segment 306-1 is the area between contoured edges 304-1 and 304-2 and CD edges 312-1 and 312-2. The lengths of CD edges 312-1 and 312-2 are then determined. The lengths may be determined using line scan techniques or any other techniques known in the art. Accordingly, the area of segment 306-1 and the lengths of CD edges 312-1 and 312-2 are determined. This process continues for each segment 306 in generated contour object 300. The adjusted length is then determined based on the areas of each segment 306 and lengths of the CD edges 312. In one embodiment, equation 1.1 optimally provides the adjusted length over a small range of L (<5 nm) where $I_{ds}$ (Drain to source current) is linearly proportional to the W/L.

Figure 3B:
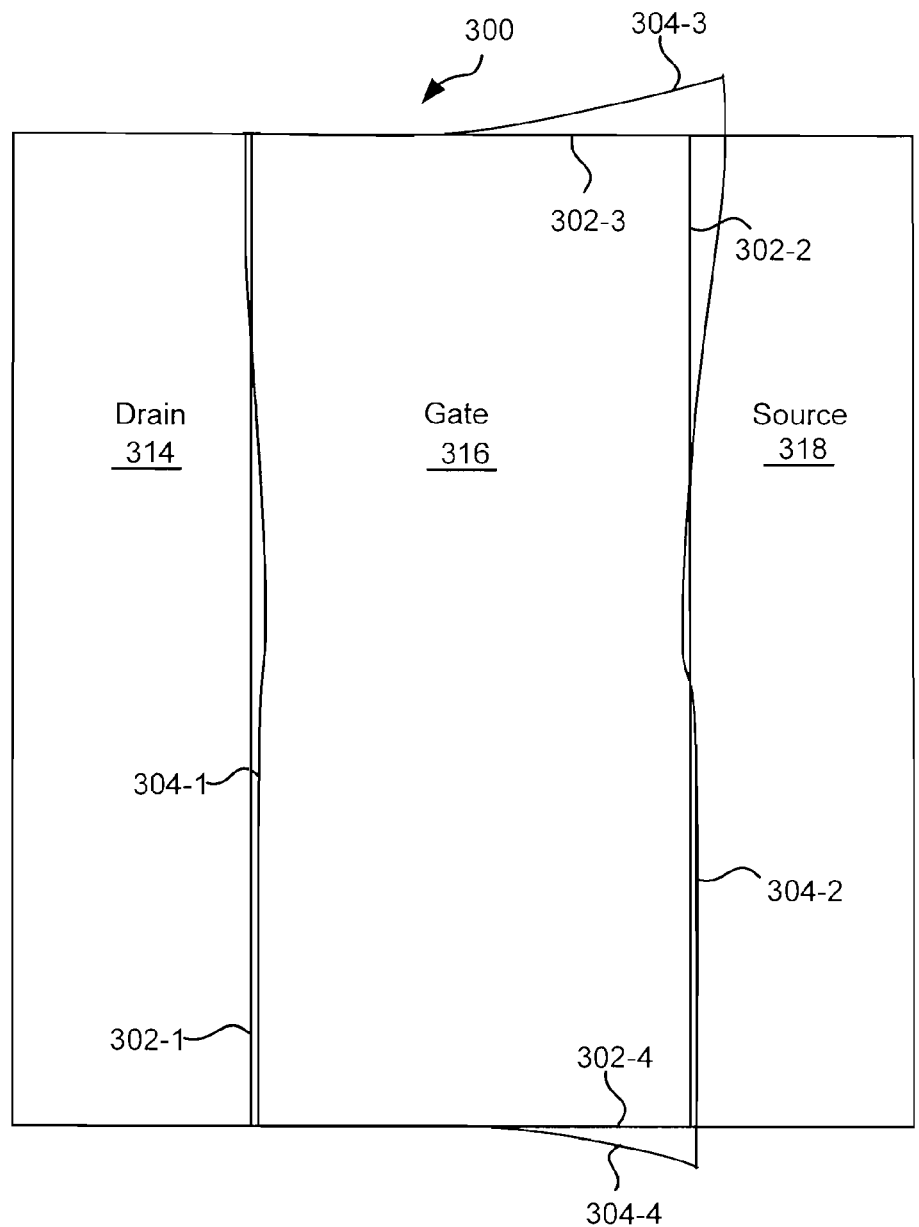
FIG. 3B shows an example of a contour simulated object used for determining an adjusted width according to one embodiment.

A process for determining the adjusted width will now be described. FIG. 3B shows an example of a generated contour object 300 used for determining an adjusted width according to one embodiment. As shown, drawn edges 302-3 and 302-4 represent edges in the drawn design of the transistor layout. Contoured edges 304-3 and 304-4, however, show the contoured edges that may result after processing variations factors are simulated in a photolithographic process.

A drain 314, a gate 316, and a source 318 are provided. The adjusted width may be determined based on process variation factors. For example, the minimum width between contoured edges 304-3 and 304-4 may be used as the adjusted width. In one embodiment, the following equation may be used to determine the adjusted width:

$$W_{adj} = MIN(W_{Drain}, W_{Source}) \cdot S_{adj}$$

where $1 \leq S_{adj} \leq [W_{MAX}/W_{MIN}]$ \quad (1.2)

In equation 1.2, the adjusted width may be determined based on sampling the various widths from 304-3 to 304-4 at various positions between drain 314 and source 318 and selecting the minimum. For example, moving from contoured edge 304-1 to contoured edge 304-2, width values between contoured edges 304-3 and 304-4 are determined. The minimum of the width values determined is then selected as the adjusted width. A SPICE adjustment coefficient may be determined from customer requirements. The SPICE adjustment adjusts the width of the drawn design to match a silicon-measured $I_{DS}$ (current between the drain and source) and compensates for $R_{DS}$ (resistance between the drain and source) variation due to non-uniform width. The SPICE adjustment is between 1 and the maximum width/minimum width. Although the minimum width determined is described as being selected, other methods of determining the adjusted width may also be appreciated.

The adjusted width and adjusted length reflect the contoured edges that are simulated due to process variations in generated contour object 300. Once the adjusted width and adjusted length are determined, they may be outputted for use in a simulation. For example, the adjusted width and adjusted length may be sent to device extraction tool 206. Also, the adjusted width and adjusted length may be stored, displayed, etc. for other uses.

Devices in the layout may be extracted using device extraction tool 206. A LVS check compares the connectivity and consistency between the logic and the physical objects in the layout. Then, additional extraction of parasitic resistances and capacitors can also be performed. The output of device extraction tool 206 is then input into transistor simulator 208.

Transistor simulator 208 is configured to perform a parametric simulation based on the adjusted length and width to verify the electrical behavior for the transistor. The parametric simulation may ensure that the physical structures will exhibit the desired electrical behavior. In one embodiment, transistor simulator 208 is a SPICE simulator that uses models to perform the simulation; however, it will be understood that other simulators may be used. The model uses the adjusted width and adjusted length determined in performing the parametric simulation. Transistor simulator 208 outputs a simulation result, which may simulate the electrical behavior of the transistor. The result may be used to verify the electrical behavior and may be stored, displayed, etc.

In one embodiment, the simulation receives only one adjusted width and one adjusted length per generated contour object 300. For example, for the object being simulated, the adjusted width and adjusted length are the only width and length values that are provided. Accordingly, the SPICE simulation methodology does not need to be significantly changed because it traditionally received one width value and one length value for an object. This is different than segmenting the object into N segments and sending multiple width and length values for each segment. Then, the results of the N simulations may be summed together to verify the objects electrical behavior. However, particular embodiments, allow transistor simulator 308 to perform the simulation using only one value for each of the adjusted width and adjusted length. Accordingly, the SPICE model may operate as it normally operates when parametric process variations are not taken into account.

Figure 4:
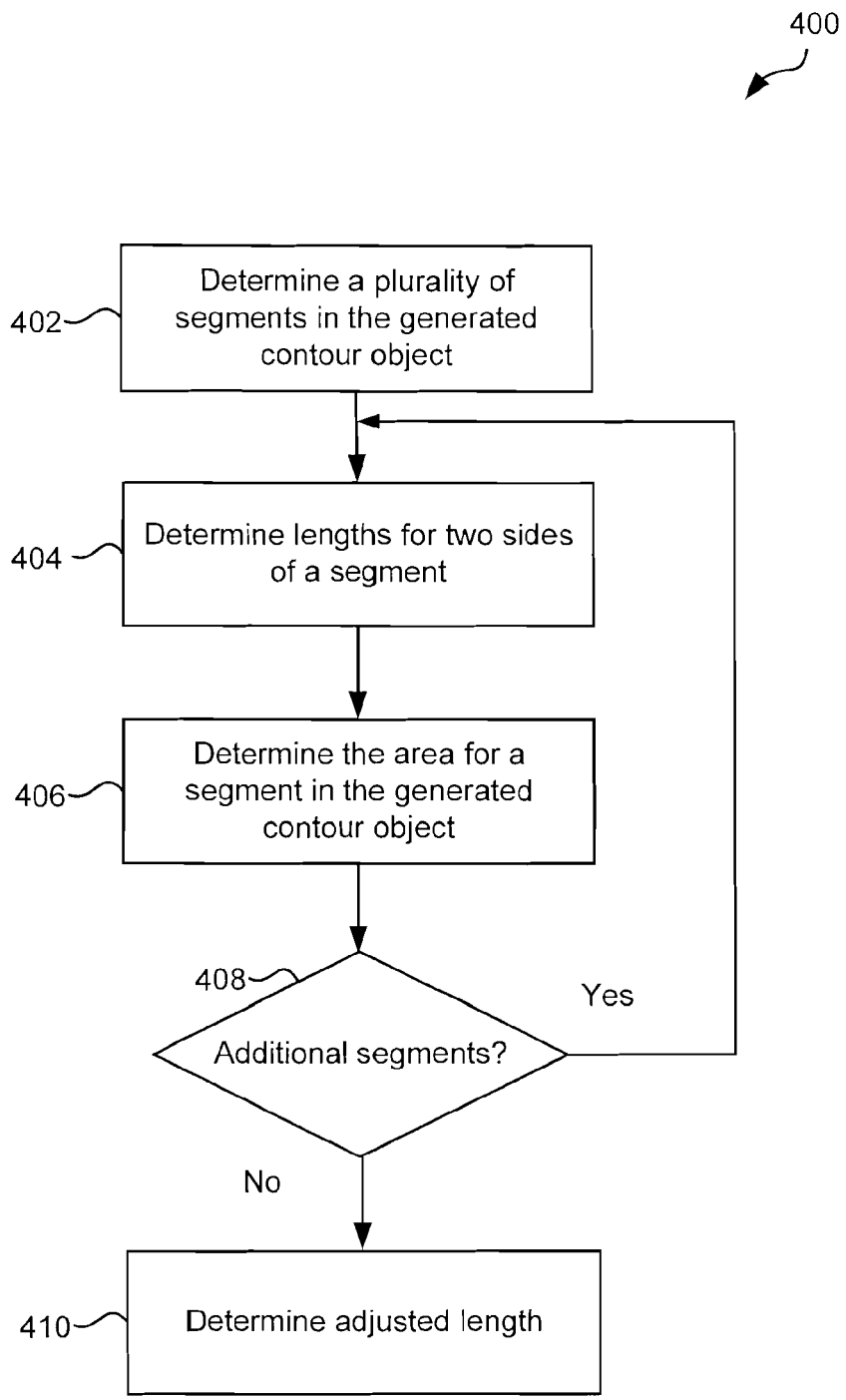
FIG. 4 depicts a simplified flowchart of a method for determining the adjusted length according to one embodiment.

FIG. 4 depicts a simplified flowchart 400 of a method for determining the adjusted length according to one embodiment. Step 402 determines a plurality of segments in the generated contour object. For example, from the top of the gate, the method may move down the gate subdividing the gate into segments 306 until the bottom of the gate is reached.

Step 404 determines lengths for two sides of a segment 306. The length is measured in between contoured edges 304-1 and 304-2 shown in FIG. 3A.

Step 406 determines the area for a segment in the contour-simulated object. For example, the area between contours edges 304-1 and 304-2 is determined for a segment.

Step 408 determines if additional segments need to be processed. If so, the process reiterates to step 404 where the area of another segment is determined.

When the process is finished, and the areas and lengths for all the segments have been determined, equation 1.1 is used to determine the adjusted length in step 410.

Figure 5:
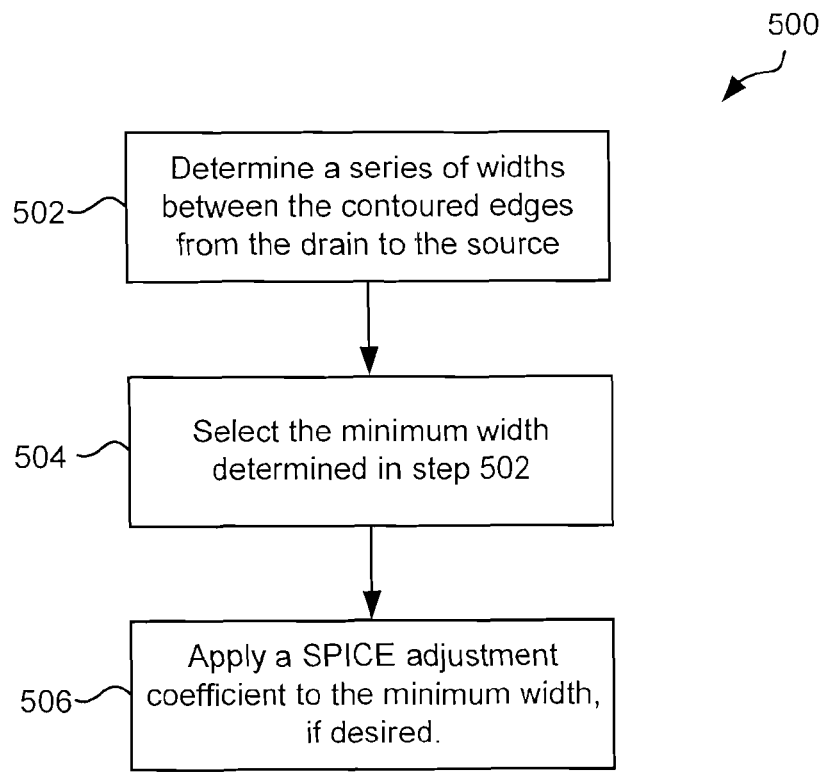
FIG. 5 depicts a simplified flowchart of a method for determining an adjusted width according to one embodiment.

FIG. 5 depicts a simplified flowchart 500 of a method for determining an adjusted width according to one embodiment. Step 502 determines a series of widths between contoured edges 304-3 and 304-4 shown in FIG. 3B from drain 314 to source 318. Any number of widths may be determined.

Step 504 selects the minimum width determined in step 502. Although the minimum width is selected, it will be understood that widths other than the minimum width may be selected.

Step 506 then applies a SPICE adjustment coefficient to the minimum width, if desired. It should be noted that the coefficient may just be one so it has no effect.

Accordingly, particular embodiments provide many advantages. For example, a simulation methodology does not need to be significantly changed. A SPICE simulation receives an adjusted length and adjusted width for a gate and can use those values to simulate the electrical behavior of the gate. This is an efficient process for taking into account processing variation factors in a parametric simulation.

Although the description has been described with respect to particular embodiments thereof, these particular embodiments are merely illustrative, and not restrictive. Although particular embodiments are described with respect to the creation of integrated circuits, it will be appreciated that the techniques of particular embodiments may be applied to any manufacturing process that is subject to process variations. Examples of processes include, but are not limited to, mask bias, overlay errors, film stack thickness variations, mask phase errors, post-exposure bake temperatures, resist development times and post exposure bake times. Other devices fabricated lithographically where particular embodiments may be applied may include Micro-electromechanical systems (MEMS), magnetic heads for disk drives, photonic devices, diffractive optical elements, nanochannels for transporting biological molecules, etc.

Any suitable programming language can be used to implement the routines of particular embodiments including C, C++, Java, assembly language, etc. Different programming techniques can be employed such as procedural or object oriented. The routines can execute on a single processing device or multiple processors. Although the steps, operations, or computations may be presented in a specific order, this order may be changed in different particular embodiments. In some particular embodiments, multiple steps shown as sequential in this specification can be performed at the same time. The sequence of operations described herein can be interrupted, suspended, or otherwise controlled by another process, such as an operating system, kernel, etc. The routines can operate in an operating system environment or as stand-alone routines occupying all, or a substantial part, of the system processing. Functions can be performed in hardware, software, or a combination of both. Unless otherwise stated, functions may also be performed manually, in whole or in part.

In the description herein, numerous specific details are provided, such as examples of components and/or methods, to provide a thorough understanding of particular embodiments. One skilled in the relevant art will recognize, however, that a particular embodiment can be practiced without one or more of the specific details, or with other apparatus, systems, assemblies, methods, components, materials, parts, and/or the like. In other instances, well-known structures, materials, or operations are not specifically shown or described in detail to avoid obscuring aspects of particular embodiments.

A "computer-readable medium" for purposes of particular embodiments may be any medium that can contain, store, communicate, propagate, or transport the program for use by or in connection with the instruction execution system, apparatus, system, or device. The computer readable medium can be, by way of example only but not by limitation, an electronic, magnetic, optical, electromagnetic, infrared, or semiconductor system, apparatus, system, device, propagation medium, or computer memory.

Particular embodiments can be implemented in the form of control logic in software or hardware or a combination of both. The control logic, when executed by one or more processors, may be operable to perform that what is described in particular embodiments.

A "processor" or "process" includes any human, hardware and/or software system, mechanism or component that processes data, signals, or other information. A processor can include a system with a general-purpose central processing unit, multiple processing units, dedicated circuitry for achieving functionality, or other systems. Processing need not be limited to a geographic location, or have temporal limitations. For example, a processor can perform its functions in "real time," "offline," in a "batch mode," etc. Portions of processing can be performed at different times and at different locations, by different (or the same) processing systems.

Reference throughout this specification to "one embodiment", "an embodiment", "a specific embodiment", or "particular embodiment" means that a particular feature, structure, or characteristic described in connection with the particular embodiment is included in at least one embodiment and not necessarily in all particular embodiments. Thus, respective appearances of the phrases "in a particular embodiment", "in an embodiment", or "in a specific embodiment" in various places throughout this specification are not necessarily referring to the same embodiment. Furthermore, the particular features, structures, or characteristics of any specific embodiment may be combined in any suitable manner with one or more other particular embodiments. It is to be understood that other variations and modifications of the particular embodiments described and illustrated herein are possible in light of the teachings herein and are to be considered as part of the spirit and scope.

Particular embodiments may be implemented by using a programmed general purpose digital computer, by using application specific integrated circuits, programmable logic devices, field programmable gate arrays, optical, chemical, biological, quantum or nanoengineered systems, components and mechanisms may be used. In general, the functions of particular embodiments can be achieved by any means as is known in the art. Distributed, networked systems, components, and/or circuits can be used. Communication, or transfer, of data may be wired, wireless, or by any other means.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope to implement a program or code that can be stored in a machine-readable medium to permit a computer to perform any of the methods described above.

Additionally, any signal arrows in the drawings/Figures should be considered only as exemplary, and not limiting, unless otherwise specifically noted. Furthermore, the term "or" as used herein is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated particular embodiments, including what is described in the Abstract, is not intended to be exhaustive or to limit the invention to the precise forms disclosed herein. While specific particular embodiments of, and examples for, the invention are described herein for illustrative purposes only, various equivalent modifications are possible within the spirit and scope, as those skilled in the relevant art will recognize and appreciate. As indicated, these modifications may be made to the present invention in light of the foregoing description of illustrated particular embodiments and are to be included within the spirit and scope.

Thus, while the present invention has been described herein with reference to particular embodiments thereof, a latitude of modification, various changes and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit. It is intended that the invention not be limited to the particular terms used in following claims and/or to the particular embodiment disclosed as the best mode contemplated for carrying out this invention, but that the invention will include any and all particular embodiments and equivalents falling within the scope of the appended claims.

We claim:

1. A method, comprising:
   with a computer,
   sampling a number of dimensions at various positions of an object in a layout of a circuit design to be created with a manufacturing process;
   determining a plurality of segments for a generated contour object of the layout object using a contour simulation, at least one of the segments having an adjusted length representing effects of processing variation that occur during the manufacturing process; and
   determining adjusted dimensions for a parametric model for simulating electrical behavior of the layout object based on the sampled dimensions and the generated contour object.

2. The method of claim 1, wherein the dimensions comprise a width, a length, or a width and a length for one or more terminals of the layout object.

3. The method of claim 1, wherein the layout object is a transistor comprising at least one or more terminals selected from the group consisting of source, drain, base, emitter, and collector.

4. The method of claim 1, further comprising outputting parameters based on the adjusted dimensions for use by an object simulator, the object simulator operable to perform a parametric simulation based on the adjusted dimensions.

5. The method of claim 4, wherein the parameters comprise at least one or more parameters selected from the group consisting of object width, object length, adjusted width, adjusted length, drawn width, drawn length, critical dimension of a transistor gate, drain-to-source current, W/L, and drain-source resistance.

6. The method of claim 4, wherein the parameters comprise a single value for an adjusted width and a single value for an adjusted length for the layout object.

7. The method of claim 1, wherein:
   the layout object comprises at least one gate, at least one source, and at least one drain;
   the sampling comprises sampling a plurality of widths of the at least one gate at a number of positions between the at least one source and the at least one drain and selecting one of the plurality of widths as an adjusted width; and
   the determining adjusted dimensions is based on the adjusted width but not other widths of the plurality.

8. The method of claim 1, wherein the determining adjusted dimensions comprises applying a SPICE adjustment.

9. The method of claim 1, further comprising segmenting the generated contour object.

10. The method of claim 1, further comprising segmenting the generated contour object and outputting the segments.

11. The method of claim 1, further comprising:
    breaking the generated contour object into one or more of the plurality of segments;
    determining the area for each of the segments; and
    determining the lengths of critical dimension edges for each of the segments, wherein the adjusted dimensions for the based at least in part on the determined areas and critical dimension lengths for each of the segments.

12. The method of claim 1, further comprising performing parametric simulation based at least in part on the adjusted dimensions for the object.

13. The method of claim 1, further comprising manufacturing a mask or reticle based on the adjusted dimensions for the layout object.

14. The method of claim 1, further comprising manufacturing a circuit based on the adjusted dimensions for the layout object.

15. The method according to claim 1, wherein the layout object comprises two or more gates.

16. One or more computer-readable storage devices or memory storing one or more computer-readable instructions that when executed by a computer processor, cause the computer processor to perform a method, the method comprising:
    sampling a number of dimensions at various positions of a layout object to be created with a manufacturing process;
    determining a plurality of segments for a generated contour object of the layout object using a contour simulation, at least one of the segments having an adjusted width representing processing variation effects due to the manufacturing process; and
    determining adjusted dimensions for a parametric model of the layout object based on the sampled dimensions and the generated contour object.

17. The computer-readable storage devices or memory of claim 16, wherein the layout object is a transistor comprising at least one or more terminals selected from the group consisting of source, drain, base, emitter, and collector.

18. The computer-readable storage devices or memory of claim 16, wherein the method further comprises outputting parameters based on the adjusted dimensions for use by an object simulator, the object simulator operable to perform a parametric simulation based on the adjusted dimensions.

19. The computer-readable storage devices or memory of claim 18, wherein the parameters comprise a single value for an adjusted width and a single value for an adjusted length for the layout object.

20. The computer-readable storage devices or memory of claim 16, wherein:
the layout object comprises at least one gate, at least one source, and at least one drain;
the sampling comprises sampling a plurality of widths of the at least one gate at a number of positions between the at least one source and the at least one drain and selecting one of the plurality of widths as an adjusted width; and
the determining adjusted dimensions is based on the adjusted width but not other widths of the plurality.

21. The computer-readable storage devices or memory of claim 16, wherein the method further comprises segmenting the generated contour object.

22. The computer-readable storage devices or memory of claim 16, wherein the method further comprises:
breaking the generated contour object into one or more segments;
determining the area for each of the segments; and
determining the lengths of critical dimension edges for each of the segments, wherein the adjusted dimensions for the based at least in part on the determined areas and critical dimension lengths for each of the segments.

23. A method, comprising:
with a computer,
segmenting a drawn object in a layout of a circuit design into a plurality of segments;
determining deviations between the segments and one or more contoured edges generated for the object, the contoured edges being generated based on processing variation factors for a manufacturing process; and
determining adjusted dimensions for the drawn object based at least in part on the deviations,
wherein the layout object comprises at least one gate, at least one source, and at least one drain.

24. The method of claim 23, further comprising:
determining one or more areas corresponding to a respective one or more of the segments; and
determining one or more parametric variation factors for the drawn object based on the areas, the parametric variation factors usable to determine a parametric model for simulation of the electrical behavior of the drawn object.

25. The method of claim 23, wherein the adjusted dimensions are adjusted to correspond to a silicon-measured drain-source current and to compensate for drain-source resistance variation.

26. The method according to claim 23, wherein the layout object comprises two or more gates.

27. A method comprising:
a step for sampling a number of dimensions at various positions of an object in a layout of a circuit design to be created with a manufacturing process;
a step for determining a generated contour object of the layout object; and
a step for determining adjusted dimensions for a parametric model for simulating electrical behavior of the layout object based on the sampled dimensions and the generated contour object.

28. The method of claim 27, further comprising:
a step for performing parametric simulation based at least in part on the adjusted dimensions.

29. One or more computer-readable storage devices or memory storing one or more computer-readable instructions that when executed by a computer processor, cause the computer processor to perform a method, the method comprising:
determining deviations between a plurality of segments of a drawn object in a layout of a circuit design and one or more contoured edges generated for the drawn object, the contoured edges being generated based on processing variation factors for a manufacturing process to be used to fabricate the circuit design layout;
determining adjusted dimensions for the drawn object based at least in part on the deviations.

30. The computer-readable storage devices or memory of claim 29, wherein the method further comprises:
determining one or more areas corresponding to a respective one or more of the segments; and
determining one or more parametric variation factors for the drawn object based on the areas, the parametric variation factors usable to determine a parametric model for simulation of the electrical behavior of the drawn object.

31. The computer-readable storage devices or memory of claim 29, wherein the adjusted dimensions are adjusted to correspond to a silicon-measured drain-source current and to compensate for drain-source resistance variation.

* * * * *